(12) United States Patent
Mehraeen et al.

(10) Patent No.: US 11,569,682 B2
(45) Date of Patent: Jan. 31, 2023

(54) SYSTEM AND METHOD FOR A FAST POWER NETWORK SIMULATOR

(71) Applicants: Shahab Mehraeen, Baton Rouge, LA (US); Boyu Wang, Baton Rouge, LA (US)

(72) Inventors: Shahab Mehraeen, Baton Rouge, LA (US); Boyu Wang, Baton Rouge, LA (US)

(73) Assignee: Board of Supervisors of Louisiana State University and Agricultural and Mechanical College, Baton Rouge, LA (US)

( * ) Notice: Subject to any disclaimer, the term of this patent is extended or adjusted under 35 U.S.C. 154(b) by 908 days.

(21) Appl. No.: 16/465,891

(22) PCT Filed: Dec. 1, 2017

(86) PCT No.: PCT/US2017/064273
§ 371 (c)(1),
(2) Date: May 31, 2019

(87) PCT Pub. No.: WO2018/102720
PCT Pub. Date: Jun. 7, 2018

(65) Prior Publication Data
US 2020/0091764 A1 Mar. 19, 2020

Related U.S. Application Data

(60) Provisional application No. 62/428,812, filed on Dec. 1, 2016.

(51) Int. Cl.
*H02J 13/00* (2006.01)
*G06F 30/367* (2020.01)
(Continued)

(52) U.S. Cl.
CPC ........ *H02J 13/00001* (2020.01); *G06F 17/13* (2013.01); *G06F 30/367* (2020.01);
(Continued)

(58) Field of Classification Search
CPC .......... H02J 13/00001; H02J 3/06; H02J 3/24; H02J 3/46; H02J 2203/20; G06F 17/13;
(Continued)

(56) References Cited

U.S. PATENT DOCUMENTS

| 5,317,525 | A | * | 5/1994 | Taoka | ....................... G06J 1/00 |
| | | | | | 703/18 |
| 7,953,581 | B2 | * | 5/2011 | Yu | ......................... G06F 30/367 |
| | | | | | 703/2 |

(Continued)

OTHER PUBLICATIONS

V. Jalili-Marandi, F. J. Ayres, E. Ghahremani, J. Bélanger and V. Lapointe, "A real-time dynamic simulation tool for transmission and distribution power systems," 2013 IEEE Power & Energy Society General Meeting, 2013, pp. 1-5, doi: 10.1109/PESMG.2013.6672734. (Year: 2013).*

(Continued)

*Primary Examiner* — Mohammad Ali
*Assistant Examiner* — Dhruvkumar Patel
(74) *Attorney, Agent, or Firm* — Venable LLP; Keith G. Haddaway; Ryan T. Ward

(57) ABSTRACT

Systems, methods, and non-transitory computer-readable storage media for a fast power network simulator. A system configured per this disclosure can use identify a power network, the power network comprising generators, transmission lines, and loads, and receive a model of the power network. The model of the power network can include: models of the generators modeled as differential equations, and models of the transmission lines and the loads modeled as algebraic equations. The system can convert, via a processor, the algebraic equations of the models of the trans- (Continued)

mission lines and the loads to additional differential equations, then combine, via the processor, the differential equations and the additional differential equations, to yield combined differential equations. The system can then iteratively solve linear equations, via the processor, associated with the combined differential equations, to yield solutions, and output the solutions as part of a power simulation of the power network.

17 Claims, 7 Drawing Sheets

(51) Int. Cl.
    *G06F 17/13*     (2006.01)
    *H02J 3/06*     (2006.01)
    *H02J 3/24*     (2006.01)
    *H02J 3/46*     (2006.01)

(52) U.S. Cl.
    CPC ............... *H02J 3/06* (2013.01); *H02J 3/24* (2013.01); *H02J 3/46* (2013.01); *H02J 2203/20* (2020.01)

(58) Field of Classification Search
    CPC ......... G06F 30/367; G06F 7/60; Y02E 60/00; Y04S 10/40; Y04S 40/20
    See application file for complete search history.

(56) References Cited

U.S. PATENT DOCUMENTS

| | | | |
|---|---|---|---|
| 2005/0010381 A1* | 1/2005 | Maudal | G06F 17/13 703/2 |
| 2015/0149132 A1* | 5/2015 | Huang | G06F 17/13 703/2 |
| 2015/0286759 A1* | 10/2015 | Rehtanz | G06F 30/33 703/18 |

OTHER PUBLICATIONS

V. Jalili-Marandi, F. J. Ayres, E. Ghahremani, J. Bélanger and V. Lapointe, "A real-time dynamic simulation tool for transmission and distribution power systems," 2013 IEEE Powers & Energy Society General Meeting, 2013, pp. 1-5, doi: 10.1109/PESMG.2013. 6672734. (Year: 2013).*

* cited by examiner

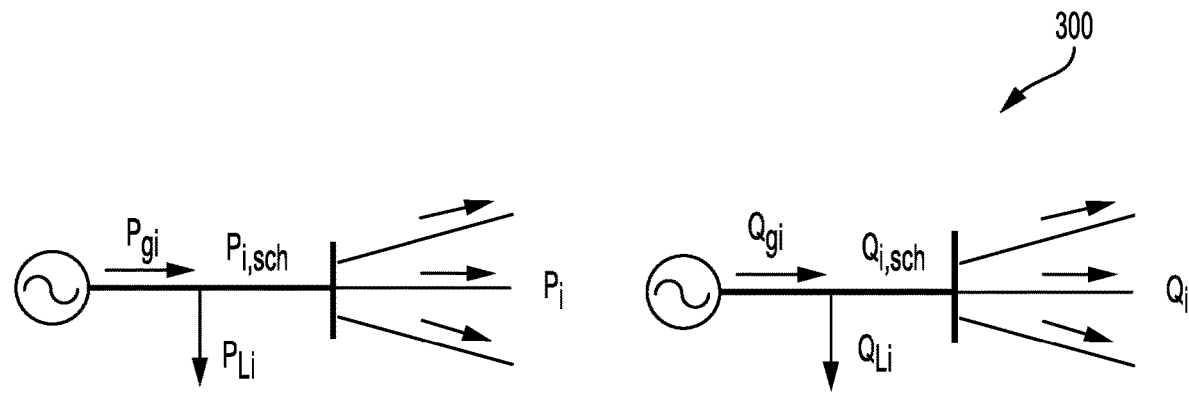
FIG. 3A
FIG. 3B
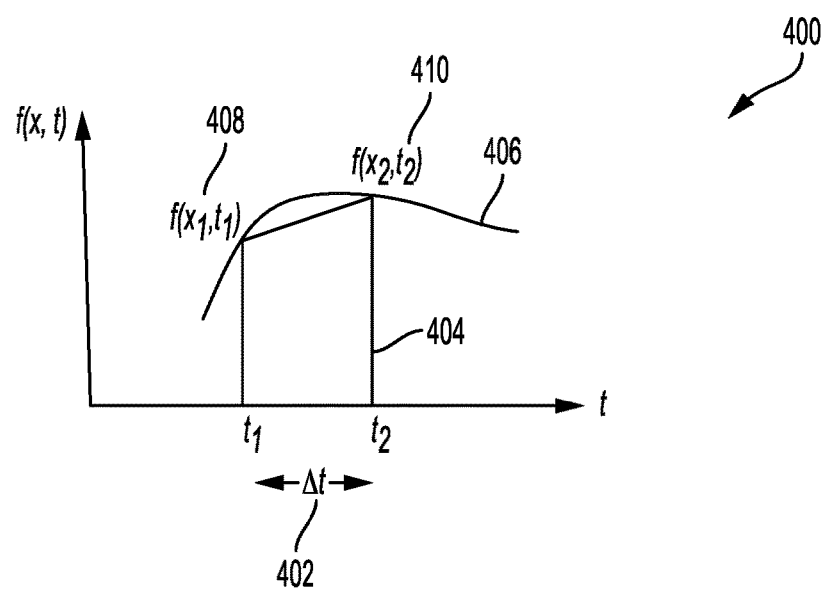
FIG. 4

SYSTEM AND METHOD FOR A FAST POWER NETWORK SIMULATOR

PRIORITY

The present disclosure claims priority to U.S. Provisional Patent Application 62/428,812, filed Dec. 1, 2016, the contents of which are incorporated herein by reference in their entirety.

BACKGROUND

1. Technical Field

The present disclosure relates to power system stability analysis and more specifically to using differential equations to model grid generators, transmission lines, and loads.

2. Introduction

Power system stability analysis relies on power network simulators that find the power network variables such as voltages and currents, numerically. The stability studies are performed using off-line simulations that represent dynamical behavior of the power grids when affected by disturbances such as short circuits, sudden load changes, line disconnections, sudden topology changes, renewable energy interactions, etc. Currently available simulators for these studies include (1) dynamical-model simulators and (2) differential-algebraic-model simulators, each with simulation time-steps in the range of 5 ms or less. Dynamical-model simulators such as Matlab/Simulink and EMTP employ dynamical models of the grid generators, transmission lines, and loads, while differential-algebraic model simulators utilize algebraic models of the transmission lines and loads, resulting in a faster simulation. These methods benefit from high levels of accuracy; however, the simulation times for both methods represent a significant barrier, especially with large power grids. More specifically, as power grids get larger and more complicated, the amount of time required to simulate those power grids using dynamical-model simulators and differential-algebraic model simulators grows exponentially. In the real-world, this can mean that power grid personnel must often wait hours before performing maintenance or upgrades while simulations are performed.

SUMMARY

Disclosed are systems, methods, and non-transitory computer-readable storage media for a fast power network simulator. The differential-algebraic-model simulators disclosed herein employ dynamical models of the grid generators, controllers, time-variable components, and algebraic power-flow equations to model transmission lines through impedance models and loads. The dynamic models of the generators, as well as the algebraic power-flow equations, are converted to differential equations, which can in turn be used to simulate the power system. Doing so results in significantly faster convergence compared to the dynamic-model simulators or conventional differential-algebraic model simulators.

Consider Table 1, which outlines basic distinctions over the prior simulators:

TABLE 1

| | Dynamic-model Simulators | Differential-algebraic model Simulators | This disclosure |
|---|---|---|---|
| Grid Generators | Dynamic models | Dynamic models, | Convert models or equations into differential equations (or receive as differential equation) |
| Transmission Lines | Dynamic models | Algebraic Power Flow Equations (or Ohms law) | Convert models or equations into differential equations (or receive as differential equation) |
| Loads | Dynamic models | Algebraic Power Equations (or Ohms law) | Convert models or equations into differential equations (or receive as differential equation) |
| Solution Method | Newton-Raphson/Runge-Kutta method | Newton-Raphson/Gauss-Sidel method | Runge-Kutta |
| Relative speed | Slow | Medium | Fast |

For example, in previous simulators, the set of dynamic models, or the set of nonlinear differential and algebraic equations that model the entire power grid, was solved fully or partially by the Newton-Raphson method. The Newton-Raphson method is a method to solve non-linear algebraic equations, and is utilized to find load-flow solutions in power systems in order to find the bus voltages and angles at steady-state condition. To perform the Newton-Raphson method, load flow equations, which describe the entire power grid, are utilized in the form of algebraic equations in an error loop until a convergence occurs.

By contrast, the disclosed models of power systems performing stability analysis convert all algebraic equations into differential equations, in contrast with the Newton-Raphson method. The merit of this approach is twofold: a) solving differential equations can be performed faster and more efficiently by using other available numerical algorithms such as Runge-Kutta and b) the number of executions for linear system solutions in the error loop of the Newton-Raphson method, which varies from 3 to 10 (or higher), can be reduced to 2 or 4, depending on the solver.

Consider the following explanation. Power systems are modeled by elements which change (that is, are dynamic), such as generators, and static elements, such as transmission lines and loads. The conventional models present the dynamic elements as differential equations and the static elements as algebraic equations. The previously available simulation method relied on solving the differential equations, then solving algebraic equations, a process that can take hours for a standard study (depending on the size of the power grid). By contrast, simulators configured according to this disclosure convert the algebraic equations of the static elements to differential equations, then solve each portion of the overall equation using distinct algorithms (such as the Runge-Kutta), resulting in much greater convergence speeds. Conversion of the algebraic equations to differential equations reduces the overall number of executions of the linear system solutions required, which is a time consuming part in the currently available methods.

BRIEF DESCRIPTION OF THE DRAWINGS

FIG. 3 illustrates an example network power balance diagram of Bus i;

FIG. 4 illustrates an example of a trapezoidal integration algorithm;

DETAILED DESCRIPTION

Figure 1:
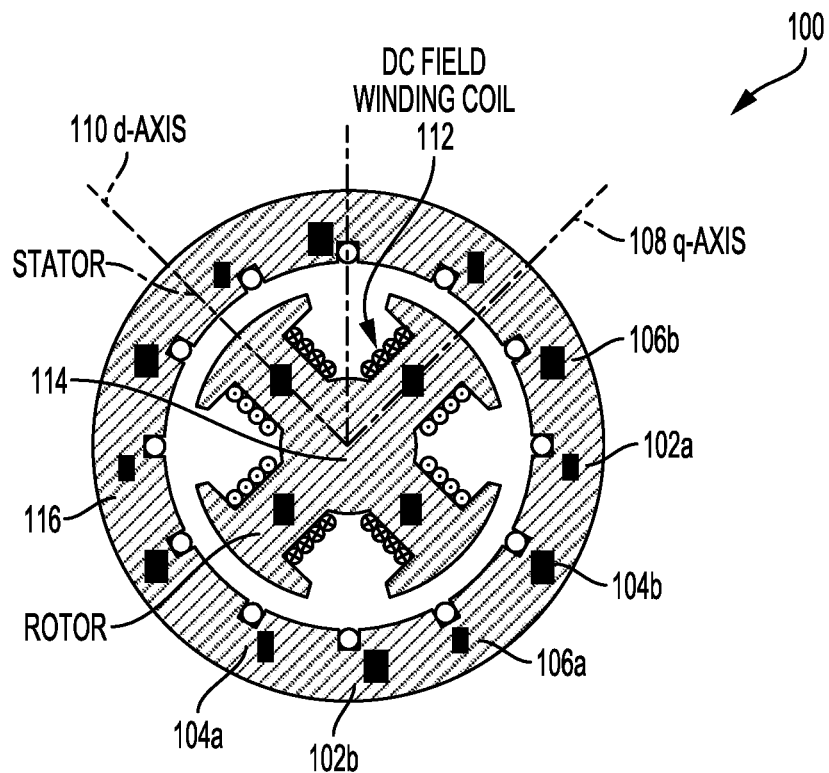
FIG. 1 illustrates an example of a two-axis generator.

A system, method and computer-readable media are disclosed which provide for fast power network simulations. An exemplary method of performing the concepts disclosed herein can include: identifying a power network, the power network comprising generators, transmission lines, and loads; receiving a model of the power network, the model of the power network comprising: models of the generators and dynamical components modeled as differential equations; and models of the transmission lines and the loads modeled as algebraic equations; converting, via a processor, the algebraic equations of the models of the transmission lines and the loads to additional differential equations; combining, via the processor, the differential equations and the additional differential equations, to yield combined differential equations; iteratively solving linear equations, via the processor, associated with the combined differential equations, to yield solutions; and outputting the solutions as part of a power simulation of the power network.

An exemplary system configured as disclosed herein can include: a processor; and a non-transitory computer-readable storage device having instructions stored which, when executed by the processor, cause the processor to perform operations comprising: identifying a power network, the power network comprising generators, transmission lines, and loads; receiving a model of the power network, the model of the power network comprising: models of the generators and dynamical components modeled as differential equations; and models of the transmission lines and the loads modeled as algebraic equations; converting the algebraic equations of the models of the transmission lines and the loads to additional differential equations; combining the differential equations and the additional differential equations, to yield combined differential equations; iteratively solving linear equations associated with the combined differential equations, to yield solutions; and outputting the solutions as part of a power simulation of the power network.

An exemplary non-transitory computer-readable storage device can include instructions stored which, when executed by a computing device, cause the computing device to perform operations including: identifying a power network, the power network comprising generators, transmission lines, and loads; receiving a model of the power network, the model of the power network comprising: models of the generators and dynamical components modeled as differential equations; and models of the transmission lines and the loads modeled as algebraic equations; converting the algebraic equations of the models of the transmission lines and the loads to additional differential equations; combining the differential equations and the additional differential equations, to yield combined differential equations; iteratively solving linear equations associated with the combined differential equations, to yield solutions; and outputting the solutions as part of a power simulation of the power network.

SECTION 1: CONVENTIONAL DIFFERENTIAL-ALGEBRAIC MODEL FOR DYNAMIC MODEL OF POWER SYSTEM

This section introduces the conventional differential-algebraic (DA) model that describes the dynamic behavior of the power system. More specifically, a transient stability analysis of the power system requires solving DA equations. Previously, a major obstacle for solving DA equations is that there is no known analytical approach to have a time domain solution for these nonlinear equations. Thus, numerical methods are mainly utilized to solve the differential-algebraic equations.

This section is organized in three sections. The first section briefly introduces the DA model using general mathematical form of a generator. The second section shows the differential equations describing a two-axis generator model in the power system. The last section introduces the algebraic equations when dealing with a multi-machine power system. A power system is called multi-machine when many synchronous generators at different buses are interconnected together by transformers and transmission lines.

1.1 Power System Differential-Algebraic Model

The differential-algebraic equations (DAE) model of the power system is as follows:

$$\begin{cases} \dot{y} = f(y, x, u) \\ 0 = g(y, x) \end{cases} \quad (1)$$

In (1), f represents all dynamic characteristics of the power system which mainly include generator dynamics. The system state variables such as generator angle $\delta$, generator speed $\omega$, and other generator dynamical parameters are shown by y. Vector x denotes all system algebraic variables such as bus voltages V and bus angles $\theta$. Input vector u represents inputs to the power system such as generator input torque and reference voltage $V_{ref}$.

1.2 Differential Equations

For transient stability analysis different generator models may be used. The method disclosed herein is not dependent on the generator model, and thus, two-axis model which is more accurate than the classical generator model in extended transient analysis is explained here as an example. This method can be extended to different generator models with no limitations. Unlike round-rotor machine, the salient-pole machine has a narrower air gap along the direct axis comparing to the quadrature axis for each pole. The two-axis generator model 100 is shown in FIG. 1. As illustrated, do field winding coils 112 are on a spinning rotor 114. As the rotor spins, distributed windings 102a, 102b, 104a, 104b, 106a, 106b are exposed to the magnetic fields, resulting in electrical generation.

By neglecting d-axis 110 and q-axis 108 open circuit sub-transient time constants $T_{do}'$ and $T_{q0}'$ a two-axis generator model generator differential equations are formed as follows:

$$\dot{\delta}(i) = \omega(i) - \omega_s \quad (2)$$

where $\delta$ and $\omega$ denote the generator angle and speed; $\omega_s$ is the nominal speed of the generator. Next, the speed can be represented as $$\dot{\omega}(i) = \qquad (3)$$
$$\frac{1}{M} \times \left\{ T_M(i) + \frac{V_I}{x'_d(i)} \times [E'_d(i)\cos(\theta(i) - \delta(i)) + E'_q(i) \times \sin(\theta(i) - \delta(i))] \right\}$$

where M denotes the inertia constant of generator; $T_M$ is mechanical input torque; V denotes the bus voltage; $x'_d$ is the direct-axis transient reactance; $E'_d$ and $E'_q$ are the transient voltage of d-axis and q-axis, respectively; and $\theta$ is the angle of the bus. Variables $E'_d$ and $E'_q$ are defined as $$\dot{E}'_q(i) = \frac{1}{T_{d0}(i)} \times \left[ (-1) \times \frac{x_{d(i)}}{x'_d(i)} \times E'_q(i) + \right. \qquad (4)$$
$$\left. \frac{x_d(i) - x'_d(i)}{x'_d(i)} \times V(I) \times \cos(\theta(i) - \delta(i)) + E_{fd}(i) \right]$$

and $$\dot{E}'_d(i) = \qquad (5)$$
$$\frac{1}{T_{q0}(i)} \times \left[ (-1) * \frac{x_q(i)}{x'_d(i)} \times E'_d(i) - \frac{x_q(i) - x'_d(i)}{x'_d(i)} \times V(i) \times \sin(\theta(i) - \delta(i)) \right]$$

where $T_{d0}$ is the open circuit time constant of d-axis; $x_d$ is the d-axis reactance; $E_{fd}$ is the steady state internal voltage of the armature; $T_{q0}$ is the open circuit time constant of q-axis; and $x_q$ is the q-axis reactance. Also, $$E_{fd}(i) = \frac{1}{T_E(i)} \times [(-1) * K_E(i) \times E_{fd}(i) + V_R(i)] \qquad (6)$$

where $T_E$ is the electrical torque; $V_R$ denotes the exciter input; and $K_E$ is an exciter gain. The exciter voltage dynamics can be shown as $$\dot{V}_R(i) = \frac{1}{T_A(i)} \left[ K_A(i) \times R_F(i) - V_R(i) - \right. \qquad (7)$$
$$\left. K_A(i) \times \frac{K_F(i)}{T_F(i)} \times E_{fd}(i) + K_A(i) \times (V_{ref}(i) - V(i)) \right]$$

where $K_A$ is the amplifier gain; $R_F$ is the rate feedback; $T_A$ denotes the amplifier time constant; $V_{ref}$ is the reference voltage; $K_F$ is the feedback gain; $T_F$ is the feedback time constant. The following equations describe the turbine dynamical behavior as $$\dot{R}_F(i) = \frac{1}{T_F(i)} \times \left[ \frac{K_F(i)}{T_F(i)} \times E_{fd}(i) - R_F(i) \right] \qquad (8)$$

$$\dot{T}_M(i) = \frac{1}{T_{RH}(i)} \times \left[ (-1) \times T_M(i) + \right. \qquad (9)$$
$$\left. \left(1 - K_{HP}(i) \times \frac{T_{RH}(i)}{T_{CH}(i)}\right) \times P_{CH}(i) + K_{HP}(i) \times \frac{T_{RH}(i)}{T_{CH}(i)} \times P_{SV}(i) \right]$$

where $P_{SV}$ is the steam value position; $T_{RH}$ is the output torque of the steam; $K_{HP}$ denotes the high pressure turbine gain; $T_{CH}$ is the steam chest output torque; $P_{CH}$ is the steam chest pressure.

$$\dot{P}_{CH}(i) = \frac{1}{T_{CH}(i)} \times (P_{SV}(i) - P_{CH}(i)) \qquad (10)$$

$$\dot{P}_{SV}(i) = \frac{1}{T_{SV}(i)} \times \left( P_C(i) - P_{SV}(i) - \frac{\omega(i)}{\omega_s \times R(i)} \right) \qquad (11)$$

where $T_{SV}$ denotes the steam value torque; $P_C$ denotes the output of a load reference motor; R is the speed regulation.

A generator classical model has five parameters which are $\delta$, $\omega$, $T_M$, $P_{CH}$, and $P_{SV}$. The last three parameters are turbine parameters, which are similar comparing to two-axis generator model. Generator angle $\delta$ also has the same function as shown in equation (2). However, the classical generator model assumes a constant internal voltage due to the lack of transient status. This leads to a different function for $\omega$, $$\omega = \frac{1}{M} \left[ T_M(i) - E_g(i) \times \frac{V(i) \times \sin(\delta(i) - \theta(i))}{x'_d} \right] \qquad (12)$$

where $E_g$ denotes the internal voltage.

1.3 Algebraic Equations

There are two sets of algebraic equations, stator equation and network power balance equations. The stator power balance equations can be derived by the following algebraic equations as, $$P_{Li} + \Sigma_{j=1}^{n} B_{ij} V_i [E'_{qj} \sin(\theta_i - \delta_j) + E'_{dj} \cos(\theta_i - \delta_j)] + \Sigma_{j=n+1}^{N+n} B_{ij} V_i V_j \sin(\theta_i - \theta_j) = 0 \qquad (13)$$

and $$-Q_{Li} + \Sigma_{j=1}^{n} B_{ij} V_i [E'_{qj} \cos(\theta_i - \delta_j) + E'_{dj} \sin(\theta_i - \delta_j)] + \Sigma_{j=n+1}^{N+n} B_{ij} V_i V_j \cos(\theta_i - \theta_j) = 0 \qquad (14)$$

where $P_{Li}$ and $Q_{Li}$ denote the active power and reactive power of the load on bus $i$, and $B_{ij}$ represents the susceptance between bus i and j. The non-generator bus power-balance algebraic equations are $$P_{Li} + \Sigma_{j=n+1}^{N+n} B_{ij} V_i V_j \sin(\theta_i - \theta_j) = 0 \qquad (15)$$

$$-Q_{Li} + \Sigma_{j=n+1}^{N+n} B_{ij} V_i V_j \cos(\theta_i - \theta_j) = 0 \qquad (16)$$

Figure 2:
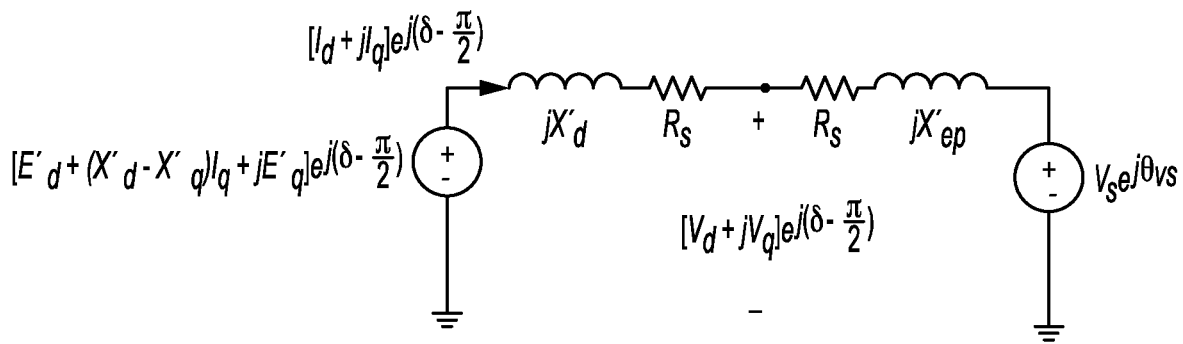
FIG. 2 illustrates an example stator algebraic relationship diagram.

The stator variables relationship can be derived from the circuit model 200 of FIG. 2.

The network power balance diagram of Bus i is depicted in FIG. 3.

In FIG. 3, $P_{gi}$ and $Q_{gi}$ denote the real power generation and reactive power generation. $P_{i,sch}$, $Q_{i,sch}$ denote the scheduled power entering the network. $P_{Li}$ and $Q_{Li}$ denote the demand power of the load on Bus i. $P_i$ and $Q_i$ are the calculated value that flow to the network. By calculating the power difference $\Delta P$ and $\Delta Q$ as (17) and (18), then adjusting them to as close possible as to zero, power balance equation are obtained.

$$\Delta P_i = P_{i,sch} - P_i \qquad (17)$$

$$\Delta Q_i = Q_{i,sch} - Q_i \qquad (18)$$

The differential and algebraic equations need to be solved together to obtain the power system states. However, this is not an easy task due to the power system nonlinear model. Previous work used linearization to solve for power system states.

Based on (1) both differential equations and algebraic equations can be linearized as:

$$\Delta \dot{x} = \frac{\partial f}{\partial x} \times \Delta x + \frac{\partial f}{\partial y} \times \Delta y + \frac{\partial f}{\partial u} \times \Delta u \tag{19}$$

$$0 = \frac{\partial g}{\partial x} \times \Delta x + \frac{\partial g}{\partial x} \times \Delta y \tag{20}$$

By solving (20), $$\Delta y = \left(\frac{\partial g}{\partial y}\right)^{-1} \times \frac{\partial g}{\partial x} \times \Delta x \tag{21}$$

is obtained.

Substitution of (21) into (19) yields a new differential equation that contains algebraic properties as $$\Delta \dot{x} = \left[\frac{\partial f}{\partial x} - \frac{\partial f}{\partial y} \times \left(\frac{\partial g}{\partial y}\right)^{-1} \times \frac{\partial g}{\partial u}\right] \times \Delta x + \frac{\partial f}{\partial u} \times \Delta u \tag{22}$$

SECTION 2: CONVENTIONAL POWER SYSTEM TRANSIENT SIMULATION ALGORITHMS

This section introduces dynamic power system simulation. While conventional tools for power system dynamical analysis may use trapezoidal integration algorithms to solve differential equations, the detailed algorithms disclosed herein may consider dynamic characteristics of generator stators and transmission lines, and may include use of the Ronge-Kutta algorithm.

2.1 Trapezoidal Integration Algorithm

The trapezoidal integration method converts the differential equation into an algebraic equation and attempts to solve it using numerical methods. For example, for a general differential equation $$\frac{dx}{dt} = f(x, t),$$

if $t=t_0$, $x=x_0$, and if $t=t_1=t_0+\Delta t$, then x can be estimated in an integral form:

$$x_1 = x_0 + \int_{t_0}^{t_1} f(x, \tau) d\tau \tag{23}$$

As shown in FIG. 4, in a trapezoidal integration algorithm 400 the integral area is approximately equal to trapezoidal area 404. That is, the integral for a function with values 406 over $\Delta t$ 402 can be approximated with a trapezoid 404, the trapezoid having values of the function 408, 410 as points of the trapezoid.

Using the points of the trapezoid illustrated in FIG. 4 with equation (22), $$x_1 = x_0 + \frac{\Delta t}{2}[f(x_0, t_0) + f(x_1, t_1)]$$

which can be rewritten as:

$$x_1 - x_0 - \frac{\Delta t}{2}[f(x_0, t_0) + f(x_1, t_1)] = 0 \tag{24}$$

Similarly, when $t=t_{n+1}$, the general relationship for x is $$x_{n+1} = x_n + \frac{\Delta t}{2}[f(x_n, t_n) + f(x_{n+1}, t_{n+1})] \tag{25}$$

2.2 Model Development

A synchronous generator can be simulated using various models including, but not limited to, a two-axis generator model and a classical generator model. Although these two models have distinct differential expressions, the process of simulating them via the classic simulation process is the same. This classic simulation process is based on Newton-Raphson method. By building a Jacobian matrix (a matrix that is formed by first order partial derivatives in a particular pattern), the trapezoidal integration algorithm can yield the preferred precision.

System operation falls into three phases in such simulations, which are: pre-fault, during the fault, and after the fault condition. The simulation steps are:

1) Input the Bus, line data, generator data, faulted time, fault cleared time and simulation time.
2) Initialize all the parameters, including variables and invariables.
3) Calculate differential equations which is explained below.
4) Calculate the algebraic equations differences ($\Delta F_1$) for all power balance equations.
5) Form a Jacobian matrix, using the derivatives of all equations pertaining to step 4 and calculate the variable changes.
6) Update the variables by using the calculated variable changes and define the error.
7) If the error is smaller than $10^{-5}$ (or other value), then go to step 3. Otherwise, go to step 9.
8) Save simulation results and renew all the variables initial value and time intervals.
9) If current simulation time is smaller than the maximum simulation time, go to step 3. Otherwise output the results.

2.2.1 Newton-Raphson Algorithm

Newton-Raphson is a widely adopted iterative algorithm for numerically solving nonlinear equation sets, and can be used as a computerized algorithm for solving power system load flow equations. The differential equations can be solved separately, or can be converted into algebraic equations and solved along with the algebraic equations, as shown in (26). Assuming there are no dynamic variables y, the nonlinear equation set is:

$$\begin{cases} \Delta F_1(x, y) = 0 \\ \Delta F_2(x, y) = 0 \end{cases} \tag{26}$$

Therefore, the approximate solutions are $x_1^{(0)}$, $x_2^{(0)}$, ..., $x_n^{(0)}$. Assuming that the difference between approximate solutions and exact solutions are $\Delta x_1$, $\Delta x_2$, $\Delta x_2$, $\Delta x_n$, then $$\begin{cases} g_1(x_1^{(0)} + \Delta x_1, x_2^{(0)} + \Delta x_2, \ldots, x_n^{(0)} + \Delta x_n) = z_1 \\ g_2(x_1^{(0)} + \Delta x_1, x_2^{(0)} + \Delta x_2, \ldots, x_n^{(0)} + \Delta x_n) = z_2 \\ g_n(x_1^{(0)} + \Delta x_1, x_2^{(0)} + \Delta x_2, \ldots, x_n^{(0)} + \Delta x_n) = z_n \end{cases} \quad (27)$$

Using Taylor series to expand the equations, the first equation can be calculated as:

$$g_1(x_1^{(0)} + \Delta x_1, x_2^{(0)} + \Delta x_2, \ldots, x_3^{(0)} + \Delta x_3) = g_1(x_1^{(0)}, x_2^{(0)} \ldots, x_n^{(0)}) + \quad (28)$$
$$\frac{\partial g_1}{\partial x_1}\Big|_0 \Delta x_1 + \frac{\partial g_1}{\partial x_2}\Big|_0 \Delta x_2 + \ldots + \frac{\partial g_1}{\partial x_n}\Big|_0 \Delta x_n + \phi_1 = z_1$$

In (28), $$\frac{\partial g_1}{\partial x_1}\Big|_0, \frac{\partial g_1}{\partial x_2}\Big|_0, \ldots, \frac{\partial g_1}{\partial x_n}\Big|_0$$

can be estimated by substituting $x_1^{(0)}, x_2^{(0)}, \ldots, x_n^{(0)}$ into (27). $\phi_1$ is a function for the product of high-order partial derivative of $g_1$ and $\Delta x_1, \Delta x_2, \ldots, \Delta x_n$. When the approximate solution is close to the exact solution, the high order of $\Delta x_1$ can be ignored and subsequently $\phi_1$ can be ignored also. Therefore (28) can be written as, $$g_1(x_1^{(0)}, x_2^{(0)}, \ldots, x_n^{(0)}) + \frac{\partial g_1}{\partial x_2}\Big|_0 \quad (29)$$
$$\Delta x_1 + \frac{\partial g_1}{\partial x_2}\Big|_0 \Delta x_2 + \ldots + \frac{\partial g_1}{\partial x_n}\Big|_0 \Delta x_n = z_1$$
$$g_2(x_1^{(0)}, x_2^{(0)}, \ldots, x_n^{(0)}) + \frac{\partial g_2}{\partial x_1}\Big|_0$$
$$\Delta x_1 + \frac{\partial g_2}{\partial x_2}\Big|_0 \Delta x_2 + \ldots + \frac{\partial g_2}{\partial x_n}\Big|_0 \Delta x_n = z_2$$
$$g_3(x_1^{(0)}, x_2^{(0)}, \ldots, x_n^{(0)}) + \frac{\partial g_2}{\partial x_1}\Big|_0$$
$$\Delta x_1 + \frac{\partial g_2}{\partial x_2}\Big|_0 \Delta x_2 + \ldots + \frac{\partial g_2}{\partial x_n}\Big|_0 \Delta x_n = z_n$$

The equation set in (28) is similar to the linear representation of linear system equations. Hence, they can be modified to matrix formation:

$$\begin{bmatrix} z_1 - g_1(x_1^{(0)}, x_2^{(0)}, \ldots, x_n^{(0)}) \\ z_2 - g_2(x_1^{(0)}, x_2^{(0)}, \ldots, x_n^{(0)}) \\ \ldots \\ z_n - g_n(x_1^{(0)}, x_2^{(0)}, \ldots, x_n^{(0)}) \end{bmatrix} = \begin{bmatrix} \frac{\partial g_1}{\partial x_1}\Big|_0 & \frac{\partial g_1}{\partial x_n}\Big|_0 & \ldots & \frac{\partial g_1}{\partial x_n}\Big|_0 \\ \frac{\partial g_2}{\partial x_1}\Big|_0 & \frac{\partial g_2}{\partial x_2}\Big|_0 & \ldots & \frac{\partial g_2}{\partial x_n}\Big|_0 \\ \frac{\partial g_n}{\partial x_1}\Big|_0 & \frac{\partial g_n}{\partial x_2}\Big|_0 & \ldots & \frac{\partial g_n}{\partial x_n}\Big|_0 \end{bmatrix} \begin{bmatrix} \Delta x_1 \\ \Delta x_2 \\ \ldots \\ \Delta x_n \end{bmatrix} \quad (30)$$

or simplified as:

$$\Delta F_1 = J_1 \Delta X_1 \quad (31)$$

where $J_1$ is the Jacobian matrix of function $g_i$; $\Delta X_1$ is column vector of $\Delta x_1$; and $\Delta F_1$ is the difference column vector representing the difference of all differential-algebraic equations. $\Delta F$ is the solution error which is zero for an ideal absolute solution.

In a power system, $f_i$ represents calculated power for all buses as shown in (17) and (18); $z_i$ denotes the scheduled power; and $x_i$ represents both the bus voltages V and bus angles $\theta$. The Newton-Raphson method can be used to calculate both the system's steady state and the system's instantaneous solution which are used to perform a stability analysis in which generator parameters and dynamics also may be considered. A two-axis generator model contains ten different dynamic parameters: $\delta$, $\omega$, $E_q'$, $E_d'$, $E_{fd}$, $V_R$, $R_F$, $T_M$, $P_{ch}$, and $P_{sv}$. All these variables are denoted as $y_i$. Considering the generator dynamics, the Jacobian matrix $\Delta X$ and $\Delta F$ can be formed as:

$$\Delta F_2 = x_{n+1} - x_n - \frac{\Delta t}{2} \times [f(x_n, y_n, u) + f(x_{n+1}, y_{n+1}, u)] = 0 \quad (32)$$

$$J = \begin{bmatrix} 1 - \frac{\Delta t}{2} \times \frac{\partial f}{\partial x} & 1 - \frac{\Delta t}{2} \times \frac{\partial f}{\partial y} \\ \frac{\partial g}{\partial x} & \frac{\partial g}{\partial y} \end{bmatrix} \quad (33)$$

$$\Delta F = \begin{bmatrix} \Delta F_1 \\ \Delta F_2 \end{bmatrix} \quad (34)$$

$$\Delta X = \begin{bmatrix} \Delta X_1 \\ \Delta y_1 \\ \ldots \\ \Delta y_n \end{bmatrix} \quad (35)$$

and the matrix formed:

$$\Delta X = J^{-1} \times \Delta F \quad (36)$$

When using the Newton-Raphson method, the power tolerances ($\Delta P$ and $\Delta Q$) are calculated using the current P, Q in each iteration, and are compared with previous power tolerances. However for generator parameters, trapezoidal integration is used to calculate the difference.

Substituting $x_i^{(0)}$ into the function, each element of $\Delta F$ and $J$ can be estimated. $\Delta x_i^{(0)}$ can be calculated by any method to solve the linear matrix equations. After the first iteration, the new value of $x_i$ can be calculated as $x_i^{(1)} = x_i^{(0)} + \Delta x_i^{(0)}$. By substituting $x_i^{(1)}$ into the equation, the new value of each entree in $\Delta F$ and $J$ can be estimated, and $x_i^{(2)}$ can be calculated as $$x_i^{(2)} = x_i^{(1)} + x_i^{(1)} \quad (37)$$

$y_i$ is calculated in the same way along with $x_i$.

The final solution of (37) is generated through iterations. Therefore, the steps for using the Newton-Raphson method can be shown as:

1) Set the initial value for each bus voltage $V^{(0)}$, angle $\theta^{(0)}$, and generator parameters.
2) Estimate power difference vectors $\Delta P^{(0)}$ and $\Delta Q^{(0)}$ using trapezoidal integration algorithm to estimate $\Delta F_2^{(0)}$.
3) Estimate each entree of Jacobian matrix.
4) Solve the equation (36) for $\Delta X$
5) Modify each variable:

$$\begin{cases} x^{(1)} = x^{(0)} + \Delta x^{(0)} \\ y^{(1)} = y^{(0)} + \Delta y^{(0)} \end{cases} \quad (38)$$

6) Estimate $\Delta F^{(1)}$ with $x^{(1)}$ and $y^{(1)}$.

7) Evaluate the convergence using a condition described as:

$$|\Delta F^{(K)}| < \varepsilon \tag{39}$$

where $|\Delta F^{(K)}|$ is the absolute value of maximum element of vector $\Delta F^{(K)}$. This is an index describing the power tolerances for final results. In this case epsilon is considered as $\varepsilon = 10^-$.

8) For $|\Delta F^{(K)}| < \varepsilon$ the iteration objective is reached and results can be shown as output, otherwise repeat from step 3 and iterate until satisfying the condition of convergence.

Figure 5:
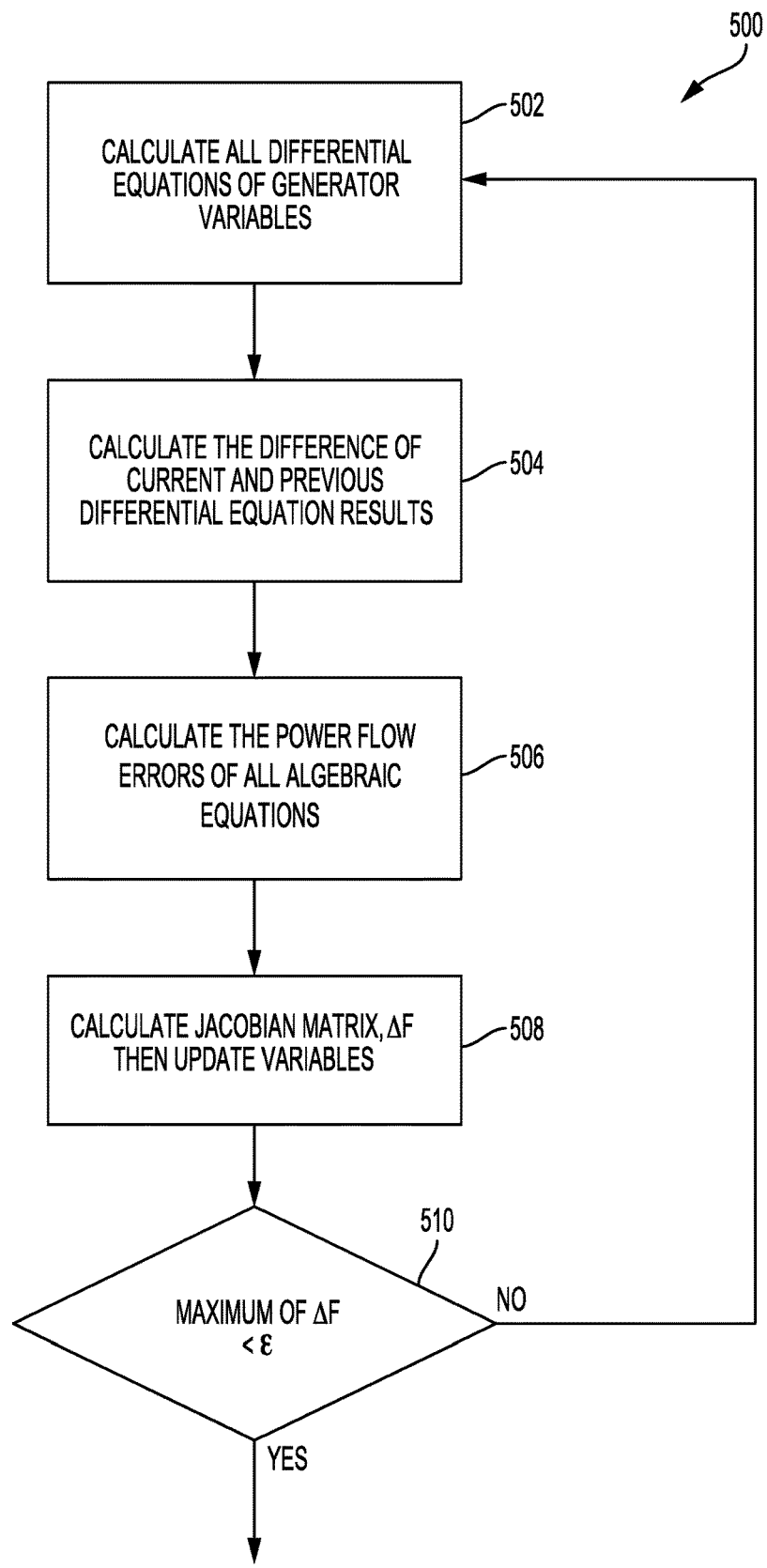
FIG. 5 illustrates an example of an error detection loop.

The Newton-Raphson method described can be used as part of an iterative error detection loop 500, as illustrated in FIG. 5. Specifically, the method allows for calculating all differential equations of generator variables (502), and the difference between the current and previous differential equation results (504). The system then calculates the power flow errors of all algebraic equations (506), calculates the Jacobian matrix, $\Delta F$, then updates the variables (see steps 3-6 above) (508). If the maximum of $\Delta F < \varepsilon$ (510), then the loop ends, but if not then the loop begins to repeat until such a convergence occurs. As the size of a system increases, this process continues to require more and more time.

2.3 Runge-Kutta Method and Procedure

A power system is a nonlinear system, models of power systems contain both differential and algebraic equations (as discussed earlier). However, it has been challenging to solve a set of differential-algebraic equations (DAE) simultaneously. As disclosed herein, the original DAE modeling the power system is converted into purely differential equations, then simulated by using the Runge-Kutta method (or any other appropriate solver) for differential equations. The Runge-Kutta method is explained here as an example to show how the disclosed purely differential model of power system can be used and solved in time domain simulations. Other similar differential equation solvers can be used with the disclosed purely differential model of a power system. The Runge-Kutta method performs calculations using the known derivatives of equations and setting initial values for variables. A basic introduction on this algorithm is now presented.

The Runge-Kutta method is very similar to a Taylor series solution. Different orders (a first order, second order, third order, etc.) in performing the Runge-Kutta method are used depending on elements which are kept from a Taylor series expansion. For example, a higher order of Runge-Kutta requires more significant items in a higher order expansions of Tylor series expansion, which results in more accurate calculations and output.

In this example, a fourth order of Runge-Kutta method is used. For step (n+1), the general function for x is:

$$x_{n+1} = x_n + \frac{1}{6}[k_1 + 2k_2 + 3k_3 + k_4] \tag{40}$$

where, $$k_1 = f(x_n, t_n)\Delta t \tag{41}$$

$$k_2 = f\left(x_n + \frac{k_1}{2}, t_n + \frac{\Delta t}{2}\right)\Delta t \tag{42}$$

$$k_3 = f\left(x_n + \frac{k_2}{2}, t_n + \frac{\Delta t}{2}\right)\Delta t \tag{43}$$

$$k_4 = f(x_n + k_3, t_n + \Delta t)\Delta t \tag{44}$$

The physical interpretations for equations (41) to (44) can be described as:
$k_1$=(slope of beginning time step) $\Delta t$
$k_2$=(first approximation of slope of middle time step) $\Delta t$
$k_3$=(second approximation of slope of middle time step) $\Delta t$
$k_4$=(slope of last time step) $\Delta t$ $$\Delta x = \frac{1}{6}(k_1 + 2k_2 + 3k_3 + k_4) \tag{45}$$

Therefore, $\Delta x$ is the incremental value of x depending on the weighted average of slope of beginning, middle and last point of the time step.

Figure 6:
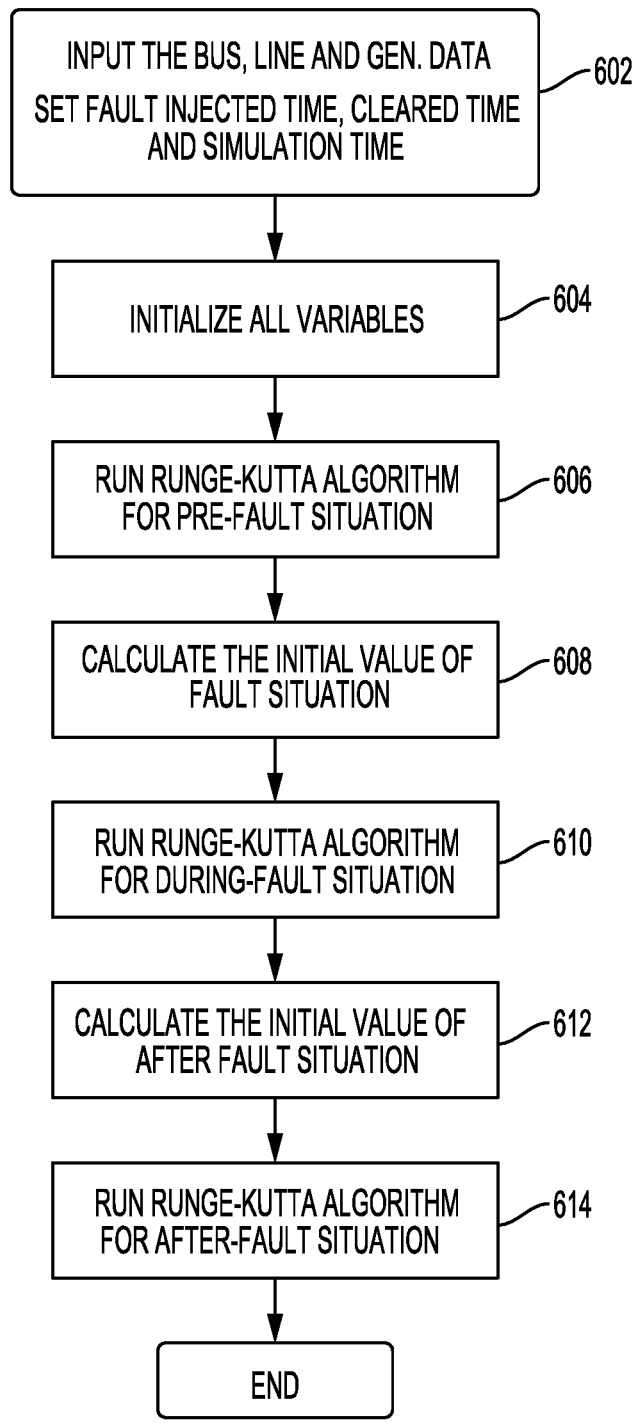
FIG. 6 illustrates an example of a dynamic stability analysis.

Using this algorithm, dynamic stability for the power system is simulated and analyzed. Dynamic stability analysis evaluates the impact of various system parameters due to a disturbance. In this case, the system is tested for relatively long time after a fault condition has affected the network. The flowchart of this algorithm is illustrated in FIG. 6.

First, the bus, line, and generator data are input into the system, the fault injection time is set, and the simulation time is cleared and reset (602). Then the various variables are initialized (604), at which point the Runge-Kutta algorithm can be run for a pre-fault situation (606). The initial value of the fault situation is calculated (608), and then the Runge-Kutta algorithm is run for a during-fault situation (610). The initial value(s) are then calculated for after-the-fault situation (612), and the Runge-Kutta algorithm runs for the after fault situation, and the algorithm ends.

SECTION 3: POWER SYSTEM DYNAMICAL MODEL DEVELOPMENT

This section explains the development of a power system dynamic model. First, dynamical equations are developed for bus voltage magnitudes and angles. All basic settings are also provided and explained in this section. Next, simulation results and analysis are presented including comparison between the disclosed method and the Newton-Raphson method. The benefits of using Runge-Kutta method are also illustrated.

3.1 Center of Inertia Coordinate Frame

The Center of Inertia coordinate uses a synchronous rotational coordinate, which is a time varying coordinate.

The center of inertia in power systems can be described using the following equations:

$$M_i = \frac{2 \times H_i}{\omega_s} \tag{46}$$

$$\delta_{coi} = \frac{1}{M_t} \sum_{i=1}^{n} M_i \times \delta_i \tag{47}$$

$$\omega_{coi} = \frac{1}{M_t} \sum_{i=1}^{1} M_i \times (\omega_i - \omega_s) \tag{48}$$

where $M_t = \sum_{i=1}^{n} M_i$, and $M_i$ is the rotor inertia, $\omega_s$ is the synchronous speed, and $H_i$ is the inertia constant.

Under the center of inertia coordinate, generator angles, generator speeds, and bus angles can be represented as:

$$\delta = \delta_i - \delta_{coi} \tag{49}$$

$$\omega = \omega_i - \omega_{coi} \tag{50}$$

$$\varphi = \theta_i - \delta_{coi} \tag{51}$$

where $\delta_i$, $\omega_i$, $\theta_i$ are the absolute values of generator angle, generator speed, and bus angle with respect to stationary references.

3.2 Differentiation of the Algebraic Equations

One of the major challenges in simulating power systems is solving the differential-algebraic equations. In the method disclosed herein, all algebraic equations are converted to differential equations in order to have pure differential characteristics. Take the two-axis generator model as an example and start from equations (13) through (16):

$$\frac{\partial \Delta P}{\partial x} = \frac{\partial \Delta P}{\partial V} \times \dot{V} + \frac{\partial \Delta P}{\partial \varphi} \times \dot{\varphi} + \frac{\partial \Delta P}{\partial \delta} \times \dot{\delta} + \frac{\partial \Delta P}{\partial E'_q} \times \dot{E}'_q + \frac{\partial \Delta P}{\partial E'_d} \times \dot{E}'_d = 0 \quad (52)$$

$$\frac{\partial \Delta Q}{\partial x} = \frac{\partial \Delta Q}{\partial V} \times \dot{V} + \frac{\partial \Delta Q}{\partial \varphi} \times \dot{\varphi} + \frac{\partial \Delta Q}{\partial \delta} \times \dot{\varphi} + \frac{\partial \Delta Q}{\partial \delta} \times \dot{E}'_q + \frac{\partial \Delta Q}{\partial E'_q} \times \dot{E}'_d = 0 \quad (53)$$

By solving (52) and (53) for $\dot{V}$ and $\dot{\varphi}$, the algebraic equations can be converted to a set of dynamic equations as follows $$\begin{bmatrix} \dot{V} \\ \dot{\varphi} \end{bmatrix} = \begin{bmatrix} A & C \\ B & D \end{bmatrix}^{-1} \times \begin{bmatrix} E & G & K \\ F & H & L \end{bmatrix} \times \begin{bmatrix} \dot{\delta} \\ \dot{E}'_q \\ \dot{E}'_d \end{bmatrix} \quad (54)$$

where $A = \frac{\partial \Delta P}{\partial V},$ $C = \frac{\partial \Delta P}{\partial \varphi},$ $E = \frac{\partial \Delta P}{\partial \delta},$ $G = \frac{\partial \Delta P}{\partial E'_q},$ $K = \frac{\partial \Delta P}{\partial E'_d},$ $B = \frac{\partial \Delta Q}{\partial V},$ $D = \frac{\partial \Delta Q}{\partial \varphi},$ $F = \frac{\partial \Delta Q}{\partial \delta},$ $H = \frac{\partial \Delta Q}{\partial E'_{qj}},$ $L = \frac{\partial \Delta Q}{\partial E'_{dj}}.$

3.3 Variable Change in Fault and after Fault Conditions

In the classical generator model, when an unexpected fault occurs or is cleared, the generator's internal voltages stay unchanged. However, upon introducing transient parameters to the generators in the two-axis model, the internal voltage is no longer a constant, despite the fact that $E_d$ and $E_q$ remain constant initially. As illustrated in FIG. 2, the internal voltage has one element ($I_q$) that relates to the altering variables; i.e., bus voltage V and bus angle $\theta$. Bus voltage V and bus angle $\theta$ are immediately affected when a fault occurs or is cleared. Accordingly, the variable $I_q$ changes follow the equation (69).

$$I_q = \frac{V \times \sin(\delta - \theta)}{x_q} \quad (69)$$

In the disclosed method utilizing the purely differential model in the specific way described, the previous status $I_q$ can be used for the faulted or after-fault condition. Unlike trapezoidal integration algorithms, here the simulation can be separated into three incidents: i.e., before fault, during fault, and after fault. The initial value can be calculated for every incident. For example, if for a fault scenario, the line impedance of the system changes, based on the new impedance and the pre-fault internal voltage and generator angle, bus voltages and bus angles for faulted condition are calculated. A similar procedure can be used for the after-fault condition.

SECTION 4: SPECIFIC CONSIDERATIONS FOR SIMULATION AND ANALYSIS

4.1 Simulation Considerations and Distinctions

Various parameters may be compared to draw conclusions about the effectiveness of performing dynamic simulations on power systems using the disclosed method versus classic methods. Here, bus voltages, bus angles, generator angles, and generator speeds are selected for comparison of accuracy. In addition, the efficiency (i.e., time required) of these two methods are compared.

For simplicity, all the load are converted to the conductance G and susceptance B using bus voltages and angles using (70) and (71) as $$G = \frac{P_l}{(V \angle \theta)^2} \quad (70)$$

$$B = \frac{Q_l}{(V \angle \theta)^2}. \quad (71)$$

However, the disclosed method may use models of nonlinear loads where they can be converted to differential representation using differentiation method disclosed in (54).

4.1.2 Generator Replacement

Figure 7:
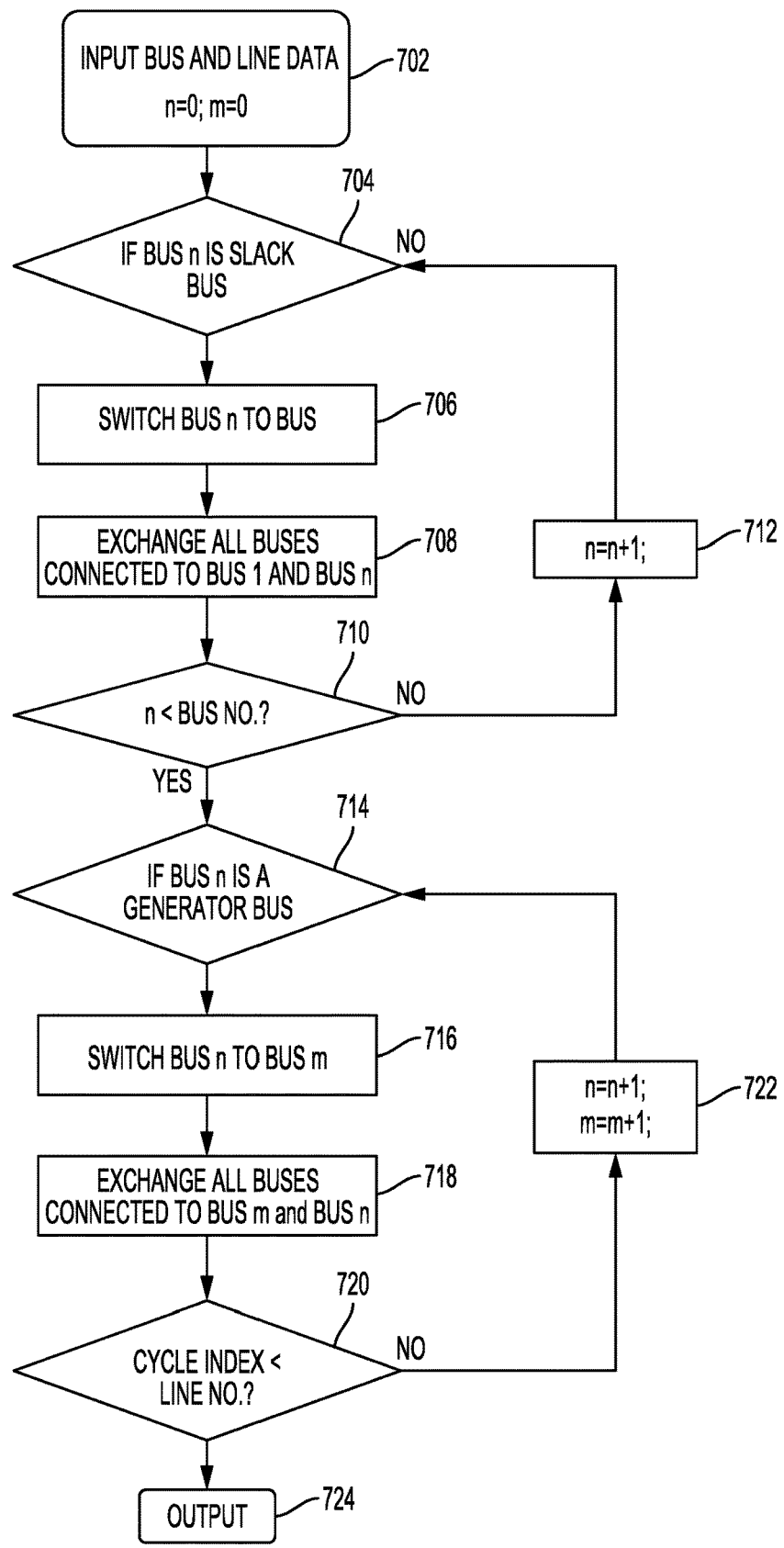
FIG. 7 illustrates an exemplary iterative process for combining generator models into bus models.

In order to reduce the complexity of the system and to simplify the computational process, all the generators can be moved to the top network buses. An example of this procedure is presented in FIG. 7.

4.2 Simulation Results and Analysis

In this section, simulation results are discussed and both algorithms are compared. First, the results of simulating an IEEE 14-bus 5-generator system using the classical generator model are compared via the classic simulation method and the new method disclosed herein. In the classic method, all differential equations are converted into algebraic equations using trapezoidal integration. Next, the two-axis generator model is similarly compared.

4.2.1 Classical Generator Model

In this simulation, from the start to t=2, all parameters are kept constant due to the steady-state operation when there is no fault. From 2 to 3 seconds a fault is occurring in the system, and the system is in transient. After 3 seconds, the fault is cleared. Due to the change in generator parameters, such as generator angle and speed, oscillation occurs in the rest of the simulation time.

While the two methods have similar precision for a IEEE-14 bus classical generator model power system on the network side, the trapezoidal method requires 97 seconds to complete. The Runge-Kutta method takes 5.4 seconds to complete, which is 18 times faster than the trapezoidal method. Therefore, the code to perform the power simulation is more efficient running the disclosed methods, without losing accuracy.

4.2.2 Two-axis generator model

In this simulation, the two-axis generator model is simulated. The disturbance occurs at t=2 second, and lasts for 0.5 second. The entire simulation time is 10 seconds. The disturbance is applied to two different systems, the IEEE 14-bus 5-generator system and the IEEE 118-bus 10-generator system, both small fault and larger fault is simulated. First in this section, the 14-bus system is tested.

From this test, and in this particular scenario, the Runge-Kutta method has a slightly larger oscillation compared to the trapezoidal method. However, the accuracy of the results between the two methods continue to align. However, there is a difference of $10^{-4}$ for the voltage change of these two method when approaching the fault.

The reason for the discrepancy in accuracy concerns the stator algebraic equations. When substituting the stator equations to power balance algebraic equations, previous voltages and bus angles are used. However, when dealing with a faulted situation, the pre-fault stator variables cannot be used because of the immediate change in variables. The simulation discussed above uses previous stator variables which have different values after fault for all variables.

On the larger, 118 bus system, a more sever disturbance may be applied to have a bigger effect as needed. Testing with this scenario one can again see similar results/accuracy between the two systems (the Newton-Raphson v. the Runge-Kutta). For example, in this larger system simulation, comparing the results for two methods shows a very similar match between both frequency and magnitude of change in parameters. However, the speed of the method disclosed herein, using the Runge-Kutta method, in this scenario takes 400 seconds. The classic method using trapezoidal approximation of the differential equations takes 14300 seconds to solve the system, which is 35.8 times slower.

SECTION 5: OVERALL CONCLUSION

Disclosed herein is a new methodology used to solve differential-algebraic equations for power systems. To reduce the complexity, all algebraic equations are converted to differential equations. These pure differential equations are solved by an ordinary differential equation solver such as the Runge-Kutta method, resulting in acceptable accuracy but many times faster.

Figure 8:
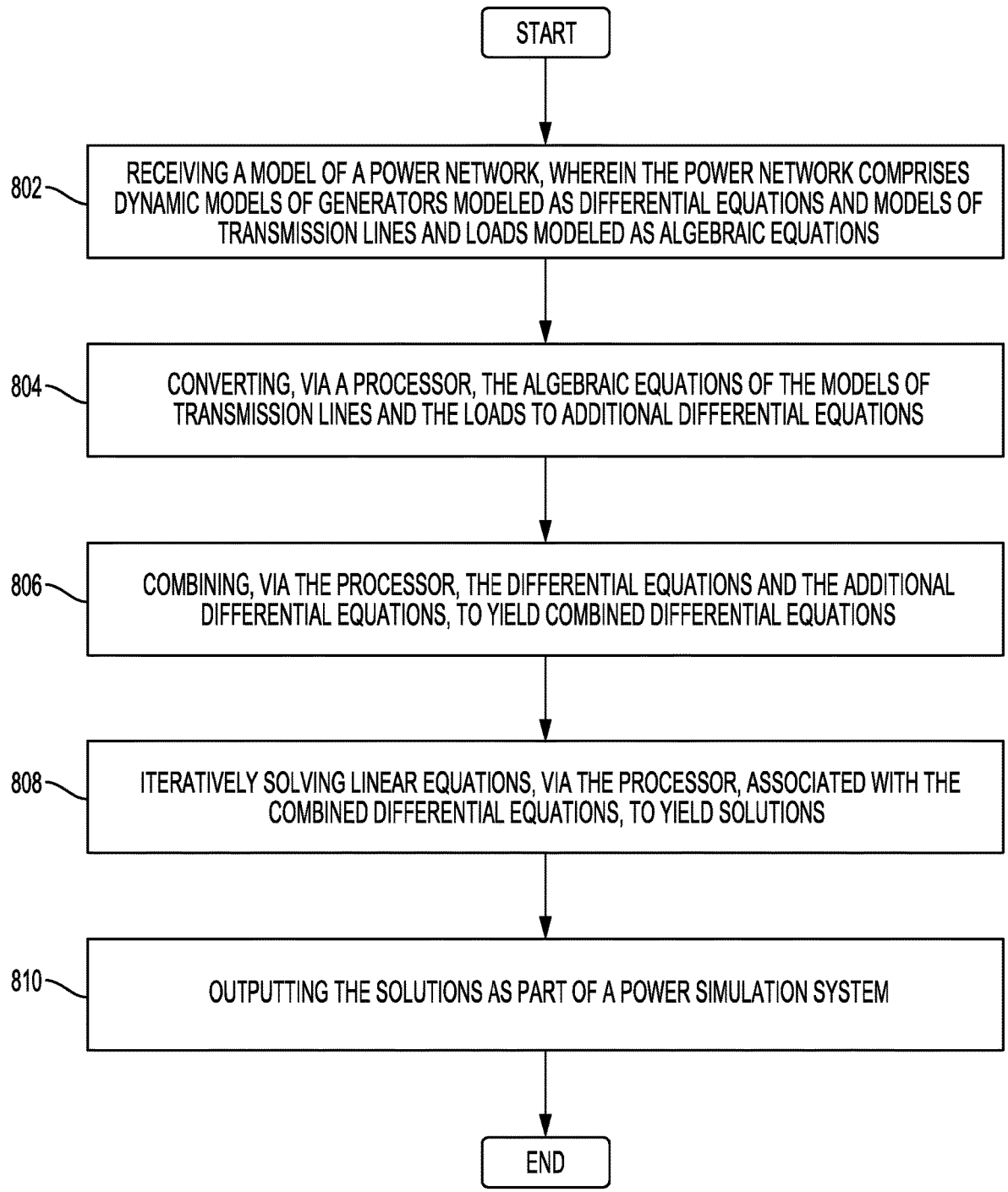
FIG. 8 illustrates an exemplary method embodiment.
Figure 9:
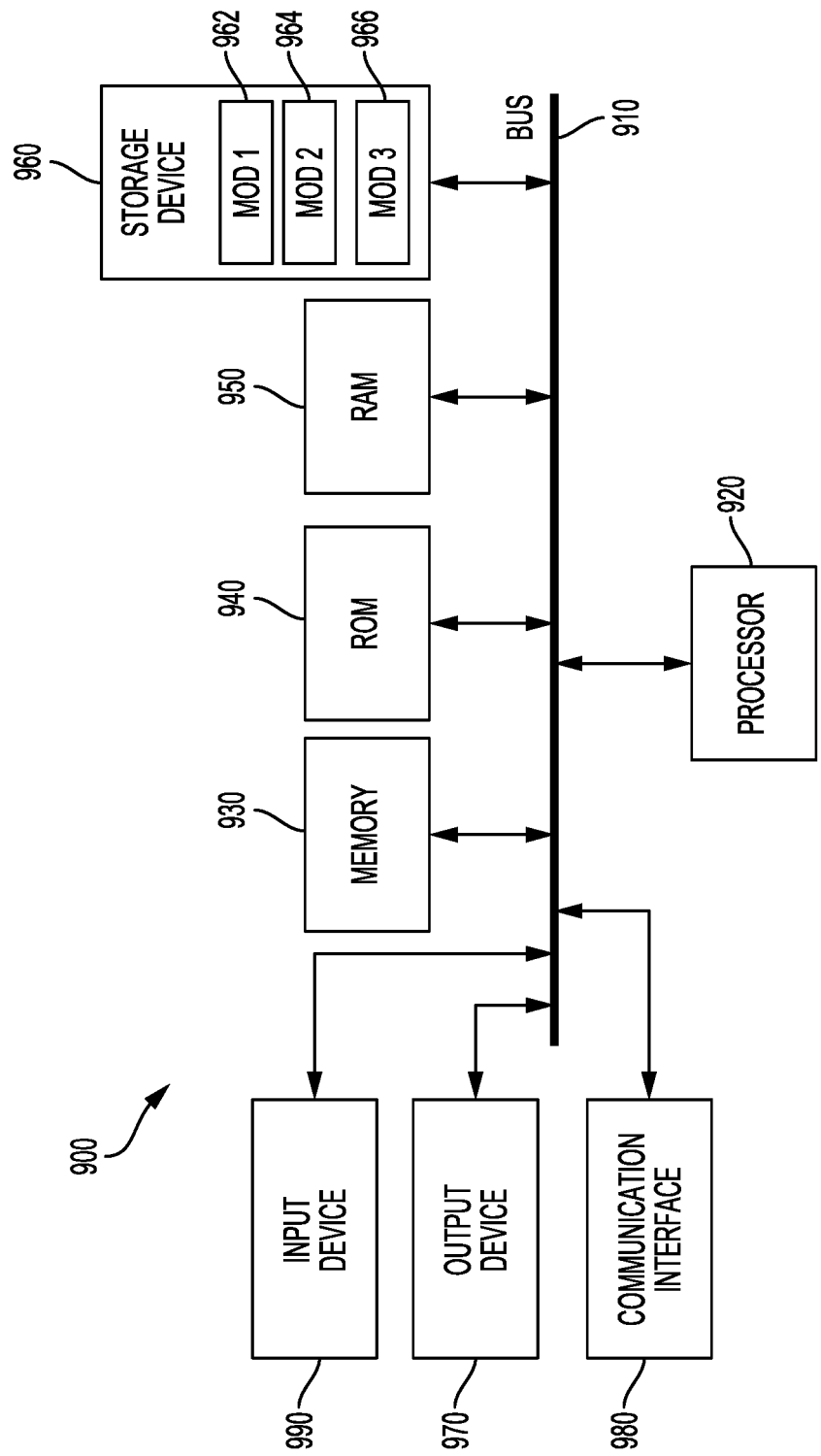
FIG. 9 illustrates an exemplary computer system.

Having disclosed some basic system components and concepts, the disclosure now turns to the exemplary method embodiment shown in FIG. 8. For the sake of clarity, the method is described in terms of an exemplary system 900 as shown in FIG. 9 configured to practice the method. The steps outlined herein are exemplary and can be implemented in any combination thereof, including combinations that exclude, add, or modify certain steps.

A system 900 can receive a model of a power network, wherein the power network comprises dynamic models of generators and other dynamic components modeled as differential equations and models of transmission lines and loads modeled as algebraic equations (802). The system 900 converts, via a processor, the algebraic equations of the models of transmission lines and the loads to additional differential equations (804). The system 900 combines, via the processor, the differential equations and the additional equations, to yield combined differential equations (806). The system 900 then iteratively solves linear equations, via the processor, associated with the combined equations, to yield solutions (808) at each step time, and outputs the solutions as part of a power simulation system (810).

In some configurations, the system 900 can iteratively solve the linear equations utilizing a Runge-Kutta algorithm. In some configurations, a number of iterations needed to solve the linear equations is based on a size of the power network. Moreover, iteratively solving the linear equations can further include forming Jacobian matrices based on the combined equations.

In some configurations, the power simulation system 900 can operate with time steps having a duration of 0.5 ms or less (for example, any time step between 0.01 ms to 0.5 ms). The power simulation system can also provide data to a power control system used to manage the power network. In some configurations, other dynamic elements of the power network are received as further differential equations and used as part of the combined differential equations.

With reference to FIG. 9, an exemplary system includes a general-purpose computing device 900, including a processing unit (CPU or processor) 920 and a system bus 910 that couples various system components including the system memory 930 such as read only memory (ROM) 940 and random access memory (RAM) 950 to the processor 920. The system 900 can include a cache of high speed memory connected directly with, in close proximity to, or integrated as part of the processor 920. The system 900 copies data from the memory 930 and/or the storage device 960 to the cache for quick access by the processor 920. In this way, the cache provides a performance boost that avoids processor 920 delays while waiting for data. These and other modules can control or be configured to control the processor 920 to perform various actions. Other system memory 930 may be available for use as well. The memory 930 can include multiple different types of memory with different performance characteristics. It can be appreciated that the disclosure may operate on a computing device 900 with more than one processor 920 or on a group or cluster of computing devices networked together to provide greater processing capability. The processor 920 can include any general purpose processor and a hardware module or software module, such as module 1 962, module 2 964, and module 3 966 stored in storage device 960, configured to control the processor 920 as well as a special-purpose processor where software instructions are incorporated into the actual processor design. The processor 920 may essentially be a completely self-contained computing system, containing multiple cores or processors, a bus, memory controller, cache, etc. A multi-core processor may be symmetric or asymmetric.

The system bus 910 may be any of several types of bus structures including a memory bus or memory controller, a peripheral bus, and a local bus using any of a variety of bus architectures. A basic input/output (BIOS) stored in ROM 940 or the like, may provide the basic routine that helps to transfer information between elements within the computing device 900, such as during start-up. The computing device 900 further includes storage devices 960 such as a hard disk drive, a magnetic disk drive, an optical disk drive, tape drive or the like. The storage device 960 can include software modules 962, 964, 966 for controlling the processor 920. Other hardware or software modules are contemplated. The storage device 960 is connected to the system bus 910 by a drive interface. The drives and the associated computer-readable storage media provide nonvolatile storage of computer-readable instructions, data structures, program modules and other data for the computing device 900. In one aspect, a hardware module that performs a particular function includes the software component stored in a tangible computer-readable storage medium in connection with the necessary hardware components, such as the processor 920, bus 910, display 970, and so forth, to carry out the function. In another aspect, the system can use a processor and computer-readable storage medium to store instructions which, when executed by the processor, cause the processor to perform a method or other specific actions. The basic components and appropriate variations are contemplated depending on the type of device, such as whether the device 900 is a small, handheld computing device, a desktop computer, or a computer server.

Although the exemplary embodiment described herein employs the hard disk 960, other types of computer-readable media which can store data that are accessible by a computer, such as magnetic cassettes, flash memory cards, digital versatile disks, cartridges, random access memories (RAMs) 950, and read only memory (ROM) 940, may also be used in the exemplary operating environment. Tangible computer-readable storage media, computer-readable storage devices, or computer-readable memory devices, expressly exclude media such as transitory waves, energy, carrier signals, electromagnetic waves, and signals per se.

To enable user interaction with the computing device 900, an input device 990 represents any number of input mechanisms, such as a microphone for speech, a touch-sensitive screen for gesture or graphical input, keyboard, mouse, motion input, speech and so forth. An output device 970 can also be one or more of a number of output mechanisms known to those of skill in the art. In some instances, multimodal systems enable a user to provide multiple types of input to communicate with the computing device 900. The communications interface 980 generally governs and manages the user input and system output. There is no restriction on operating on any particular hardware arrangement and therefore the basic features here may easily be substituted for improved hardware or firmware arrangements as they are developed.

Use of language such as "at least one of X, Y, and Z" or "at least one or more of X, Y, or Z" are intended to convey a single item (just X, or just Y, or just Z) or multiple items (i.e., {X and Y}, {Y and Z}, or {X, Y, and Z}). "At least one of" is not intended to convey a requirement that each possible item must be present.

The various embodiments described above are provided by way of illustration only and should not be construed to limit the scope of the disclosure. Various modifications and changes may be made to the principles described herein without following the example embodiments and applications illustrated and described herein, and without departing from the spirit and scope of the disclosure.

We claim:

1. A method comprising:
   identifying a power network, the power network comprising generators, transmission lines, and loads;
   receiving a model of the power network, the model of the power network comprising:
   models of the generators modeled as differential equations; and
   models of the transmission lines and the loads modeled as algebraic equations;
   converting, via a processor, the algebraic equations of the models of the transmission lines and the loads to additional differential equations;
   combining, via the processor, the differential equations and the additional differential equations, to yield combined differential equations;
   setting, via the processor, a model element to a pre-fault configuration, the model element associated with bus voltage and bus angle;
   iteratively solving linear equations, via the processor, associated with the combined differential equations and the model element in the pre-fault configuration, to yield first solutions, including a solution for the model element;
   using the first solutions to manage the power network;
   detecting, within the power network, a fault;
   updating, via the processor based on the fault, the model element to an after-fault configuration;
   iteratively solving linear equations, via the processor, associated with the combined differential equations and the model element in the after-fault configuration, to yield second solutions; and
   using the second solutions to manage the power network.

2. The method of claim 1, wherein the processor uses a time-domain nonlinear differential equation solver algorithm to iteratively solve the linear equations.

3. The method of claim 2, wherein the time-domain nonlinear differential equation solver algorithm is the Runge-Kutta algorithm.

4. The method of claim 1, wherein iteratively solving the linear equations further comprises forming Jacobian matrices based on the algebraic equations.

5. The method of claim 1, wherein the power simulation operates with time steps having a duration a range of 5 ms or greater.

6. The method of claim 1, wherein other dynamic elements of the power network are received as further differential equations and used as part of the combined differential equations.

7. A system comprising:
   a processor; and
   a non-transitory computer-readable storage device having instructions stored which, when executed by the processor, cause the processor to perform operations comprising:
   identifying a power network, the power network comprising generators, transmission lines, and loads;
   receiving a model of the power network, the model of the power network comprising:
   models of the generators modeled as differential equations; and
   models of the transmission lines and the loads modeled as algebraic equations;
   converting the algebraic equations of the models of the transmission lines and the loads to additional differential equations;
   combining the differential equations and the additional differential equations, to yield combined differential equations;
   setting a model element to a pre-fault configuration, the model element associated with bus voltage and bus angle;
   iteratively solving linear equations associated with the combined differential equations and the model element in the pre-fault configuration, to yield first solutions including a solution for the model element; and using the first solutions to manage the power network;

detecting, within the power network, a fault;

updating, based on the fault, the model element to an after-fault configuration;

iteratively solving linear equations associated with the combined differential equations and the model element in the after-fault configuration, to yield second solutions; and using the second solutions to manage the power network.

8. The system of claim 7, wherein the processor uses a time-domain differential equation solver algorithm to iteratively solve the linear equations.

9. The system of claim 8, wherein the time-domain differential equation solver algorithm is the Runge-Kutta algorithm.

10. The system of claim 7, wherein iteratively solving the linear equations further comprises forming Jacobian matrices based on the algebraic equations.

11. The system of claim 7, wherein the power simulation operates with time steps having a duration a range of 5 ms or greater.

12. The system of claim 7, wherein other dynamic elements of the power network are received as further differential equations and used as part of the combined differential equations.

13. A non-transitory computer-readable storage device having instructions stored which, when executed by a computing device, cause the computing device to perform operations comprising:

identifying a power network, the power network comprising generators, transmission lines, and loads;

receiving a model of the power network, the model of the power network comprising:

models of the generators modeled as differential equations; and models of the transmission lines and the loads modeled as algebraic equations;

converting the algebraic equations of the models of the transmission lines and the loads to additional differential equations;

combining the differential equations and the additional differential equations, to yield combined differential equations;

setting a model element to a pre-fault configuration, the model element associated with bus voltage and bus angle;

iteratively solving linear equations associated with the combined differential equations and the model element in the pre-fault configuration, to yield first solutions, including a solution for the model element; and using the first solutions to manage the power network;

detecting, within the power network, a fault;

updating, based on the fault, the model element to an after-fault configuration;

iteratively solving linear equations associated with the combined differential equations and the model element in the after-fault configuration, to yield second solutions; and using the second solutions to manage the power network.

14. The non-transitory computer-readable storage device of claim 13, wherein the computing device uses a time-domain differential equation solver algorithm to iteratively solve the linear equations.

15. The non-transitory computer-readable storage device of claim 14, wherein the time-domain differential equation solver algorithm is the Runge-Kutta algorithm.

16. The non-transitory computer-readable storage device of claim 13, wherein iteratively solving the linear equations further comprises forming Jacobian matrices based on the algebraic equations.

17. The non-transitory computer-readable storage device of claim 13, wherein the power simulation operates with time steps having a duration a range of 5 ms or greater.

* * * * *